United States Patent
Yano et al.

(10) Patent No.: US 9,408,295 B2
(45) Date of Patent: *Aug. 2, 2016

(54) SUBSTRATE FOR LIGHT-EMITTING DIODE

(71) Applicant: NGK Insulators, Ltd., Nagoya (JP)

(72) Inventors: Shinsuke Yano, Nagoya (JP); Makoto Tani, Inazawa (JP); Hirokazu Nakanishi, Kakamigahara (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/701,792

(22) Filed: May 1, 2015

(65) Prior Publication Data

US 2015/0237710 A1    Aug. 20, 2015

Related U.S. Application Data

(63) Continuation of application No. PCT/JP2012/078752, filed on Nov. 6, 2012.

(51) Int. Cl.
  *H05K 1/00*     (2006.01)
  *H05K 1/03*     (2006.01)
  (Continued)

(52) U.S. Cl.
  CPC .............. *H05K 1/0207* (2013.01); *H01L 33/62* (2013.01); *H01L 33/642* (2013.01); *H01L 33/647* (2013.01); *H05K 1/053* (2013.01); *H05K 2201/0137* (2013.01); *H05K 2201/062* (2013.01)

(58) Field of Classification Search
  CPC  H05K 1/0207; H05K 1/053; H05K 2201/062

USPC ................. 174/252, 255, 257, 258, 260, 261; 361/767

See application file for complete search history.

(56) References Cited

U.S. PATENT DOCUMENTS 6,233,817 B1 *   5/2001   Ellis ..................... H01L 23/142
                                                257/E23.006
6,548,832 B1     4/2003   Sakamoto et al.
(Continued)

FOREIGN PATENT DOCUMENTS

JP    2000-353826 A1    12/2000
JP    2006-066630 A      3/2006
(Continued)

OTHER PUBLICATIONS

International Search Report and Written Opinion (Application No. PCT/JP2012/078752) dated Feb. 5, 2013.

(Continued)

*Primary Examiner* — Sherman Ng
(74) *Attorney, Agent, or Firm* — Burr & Brown, PLLC

(57) ABSTRACT

A substrate for a light-emitting diode comprising a metal base with a thickness of a predetermined value or more is constituted so that the thickness of a top conductor for an electrical connection with a light-emitting diode (LED) in a predetermined range falls within a predetermined range and the thickness of an insulation layer which electrically insulates the metal base and the top conductor and the thickness of the top conductor meet a predetermined relation. Thereby, a substrate for a light-emitting diode which can show a high heat dissipation capacity by achieving a low thermal resistance as the total thermal resistance of the whole substrate without reducing insulation reliability and high-humidity reliability of the substrate is provided.

7 Claims, 4 Drawing Sheets

(51) Int. Cl.
*H05K 1/09* (2006.01)
*H05K 1/16* (2006.01)
*H05K 1/02* (2006.01)
*H01L 33/62* (2010.01)
*H01L 33/64* (2010.01)
*H05K 1/05* (2006.01)

(56) References Cited

U.S. PATENT DOCUMENTS

| | | | | |
|---|---|---|---|---|
| 6,818,836 | B2 * | 11/2004 | Shiraishi | H01L 21/4857 174/260 |
| 7,952,113 | B2 * | 5/2011 | Layer | F21K 9/00 257/103 |
| 2006/0258055 | A1 * | 11/2006 | Okamoto | H01L 23/3735 438/124 |
| 2009/0008142 | A1 * | 1/2009 | Shimizu | B32B 5/18 174/261 |
| 2009/0035538 | A1 | 2/2009 | Namerikawa et al. | |
| 2009/0039379 | A1 | 2/2009 | Shiraishi et al. | |
| 2009/0151982 | A1 * | 6/2009 | Oshika | H01L 23/142 174/126.2 |
| 2011/0089805 | A1 | 4/2011 | Betsuda et al. | |
| 2011/0233601 | A1 | 9/2011 | Nakayama | |
| 2012/0201037 | A1 | 8/2012 | Nakayama | |
| 2013/0001633 | A1 * | 1/2013 | Imai | H01L 33/60 257/99 |

FOREIGN PATENT DOCUMENTS

| | | |
|---|---|---|
| JP | 2006-525679 A1 | 11/2006 |
| JP | 2007-123482 A1 | 5/2007 |
| JP | 2008-159791 A1 | 7/2008 |
| JP | 2009-029134 A1 | 2/2009 |
| JP | 2009-044027 A1 | 2/2009 |
| JP | 2009-208459 A1 | 9/2009 |
| JP | 2010-274256 A1 | 12/2010 |
| JP | 2011-040622 A1 | 2/2011 |
| JP | 2011-205009 A1 | 10/2011 |
| JP | 2011/233775 A1 | 11/2011 |
| JP | 2012-084733 A1 | 4/2012 |
| JP | 2012-109513 A1 | 6/2012 |
| JP | 2012-140289 A1 | 7/2012 |
| WO | 2004/100343 A2 | 11/2004 |
| WO | 2012/067203 A1 | 5/2012 |

OTHER PUBLICATIONS

International Preliminary Report on Patentability (Application No. PCT/JP2012/078752) dated Jan. 20, 2015.
U.S. Appl. No. 14/701,730, filed May 1, 2015, Shinsuke Yano et al.
Extended European Search Report, European Application No. 12 88 8036, dated Apr. 7, 2016 (8 pages).

* cited by examiner

When the cross-section shape of the top electrode is deformed from rectangle

SUBSTRATE FOR LIGHT-EMITTING DIODE

BACKGROUND OF THE INVENTION

1. Field of the Invention

The present invention relates to a substrate for a light-emitting diode. More particularly, the present invention relates to a substrate for a light-emitting diode which can show a high heat dissipation capacity by achieving a low thermal resistance as the total thermal resistance of the whole substrate.

2. Description of Related Art

While a light-emitting diode (LED) is increasingly widely used recent years from viewpoints of energy saving etc., since an energy efficiency will fall when the temperature of an LED rises, it is important for an LED to efficiently release heat which is generated in association with light emission, and to prevent a temperature-rise of the LED. Then, in the art, various technologies for raising a heat dissipation capacity in a package and wiring substrate on which an LED is mounted have been proposed.

As an example of such technologies, for example, a technology for reducing a total thermal resistance of a whole substrate, by using as a wiring substrate a structure (heat slag type) in which an insulation layer is formed on a top of a metal base comprising (for instance, metals, such as aluminum, copper, silver and tungsten, and alloys of any of these metals, etc.) and a conductive pattern for an electrical connection with an LED is formed on a top of the insulation layer, or by using as a wiring substrate a structure (heat spreader type) in which a metal base is embedded in an insulation material with a conductive pattern for an electrical connection with an LED formed on its top, can be exemplified (for instance, refer to PTLs 1 and 2).

Since a substrate which comprises a metal base with a high thermal conductivity mentioned above has a lower thermal resistance as the total thermal resistance of the whole substrate as compared with a substrate which does not comprise such a metal base, it can more efficiently release heat which is generated in association with light emission of LED. However, an insulation layer formed on a top of a metal base generally comprises as a main material, dielectric materials, such as a resin and a ceramic, for example, and these dielectric materials have a lower thermal conductivity as compared with a metal base. A relatively low thermal conductivity, which such as insulation layer has, becomes a bottleneck in heat conduction between a conductive pattern and a metal base. Namely, when a heat dissipation capacity of a substrate is going to be further improved by further reducing a total thermal resistance of the whole substrate, there is a possibility that a relatively low thermal conductivity that an insulation layer has may become an obstacle.

The obstacle as mentioned above in a further improvement in a heat dissipation capacity of a substrate due to a relatively low thermal conductivity which an insulation layer has can be suppressed by reducing the thickness of the insulation layer, for example (for instance, refer to PTL 2). However, in a substrate according to a conventional technology, when a total thermal resistance of a whole substrate is going to be reduced by reducing a thickness of an insulation layer, there is a possibility of causing reduction of insulation reliability in the substrate. Specifically, in association with reduction of the thickness of an insulation layer, there is a possibility that it may become difficult to secure the electric insulation with a conductive pattern and a metal base and an electrical short (short-circuit) between conductive patterns through a metal base may be caused, for example.

On the other hand, although it is desirable that the thickness of an insulation layer is large from a viewpoint of securing insulation reliability of a substrate, the more the thickness of the insulation layer increases, the more the total thermal resistance of the whole substrate increases and the more the total heat dissipation capacity of the whole substrate falls due to the relatively low thermal conductivity which the insulation layer has. In addition, a way of the dimensional change accompanying a temperature change (hereinafter, may be referred to as a "thermal expansion shrinkage behavior") is different between a dielectric material which constitutes an insulation layer (for instance, a resin, a ceramic, etc.) and a material which constitutes a metal base and a conductive pattern (for instance, a metal, etc.). Therefore, there is a possibility that a fissure (crack) may occur in an insulation layer due to the above-mentioned difference in thermal expansion shrinkage behavior and so on to cause a problem, such as reduction of reliability of a substrate under a high-humidity environment (high-humidity reliability), for instance, in connection with the temperature change of the substrate in a manufacturing process of a substrate, in an implementation process of a package which contains an LED, and in an operation period after completion of the package containing an LED, etc., for example. Moreover, the larger the thickness of a metal base is, the more such a concern becomes noticeable. Furthermore, when a ceramic is adopted as a dielectric material which constitutes an insulation layer and a substrate is manufactured by co-firing such an insulation layer with a metal base and a conductive pattern, such a concern becomes more noticeable.

As mentioned above, in the art, there is a demand for a substrate for a light-emitting diode which can show a high heat dissipation capacity by achieving a low thermal resistance as the total thermal resistance of the whole substrate, without reducing insulation reliability and high-humidity reliability of the substrate.

CITATION LIST

Patent Literature

[PTL 1] Japanese Patent Application Laid-Open (kokai) No. 2000-353826

[PTL 2] Japanese Patent Application Laid-Open (kokai) No. 2006-525679

[PTL 3] Japanese Patent Application Laid-Open (kokai) No. 2009-208459

[PTL 4] Japanese Patent Application Laid-Open (kokai) No. 2009-029134

SUMMARY OF THE INVENTION

Technical Problem

As mentioned above, in the art, there is a demand for a substrate for a light-emitting diode which can show a high heat dissipation capacity by achieving a low thermal resistance as the total thermal resistance of the whole substrate, without reducing insulation reliability and high-humidity reliability of the substrate. The present invention has been conceived in order to meet such a demand. Namely, the present invention has one purpose to provide a substrate for a light-emitting diode which can show a high heat dissipation capacity by achieving a low thermal resistance as a total thermal resistance of a whole substrate, without reducing insulation reliability and high-humidity reliability of a substrate.

Solution to Problem

The above-mentioned purpose is attained by,
a substrate for a light-emitting diode, comprising:
a metal base,
an insulation layer which comprises a dielectric material that mainly contains a ceramic and which is placed on at least one top of said metal base, and
a top conductor which is at least partially embedded within said insulation layer and at least partially exposed out of the top of said insulation layer on the side opposite to said metal base,
wherein:
the thickness (Tm) of said metal base in a thickness direction which is defined as a direction intersecting perpendicularly with said at least one top of said metal base is not less than 100 micrometers,
the thickness (Tc) of said top conductor in said thickness direction is not less than 20 micrometers and 100 micrometers or less, and
the thickness (Ti) of said insulation layer in said thickness direction and said thickness (Tc) of said top conductor in said thickness direction meet the relation expressed by a formula (1) shown below.

$$-40 \times Ti + 260 \leq Tc \leq -40 \times Ti + 1700 \qquad (1)$$

Advantageous Effects of Invention

In accordance with the substrate for a light-emitting diode according to the present invention, a high heat dissipation capacity can be shown by achieving a low thermal resistance as the total thermal resistance of the whole substrate, without reducing insulation reliability and high-humidity reliability of the substrate. As a result, it can be suppressed that the temperature of an LED rises by heat generation in association with light emission and the energy efficiency of the LED falls, without reducing insulation reliability and high-humidity reliability of a package containing the LED.

DETAILED DESCRIPTION OF THE INVENTION

Figure 1:
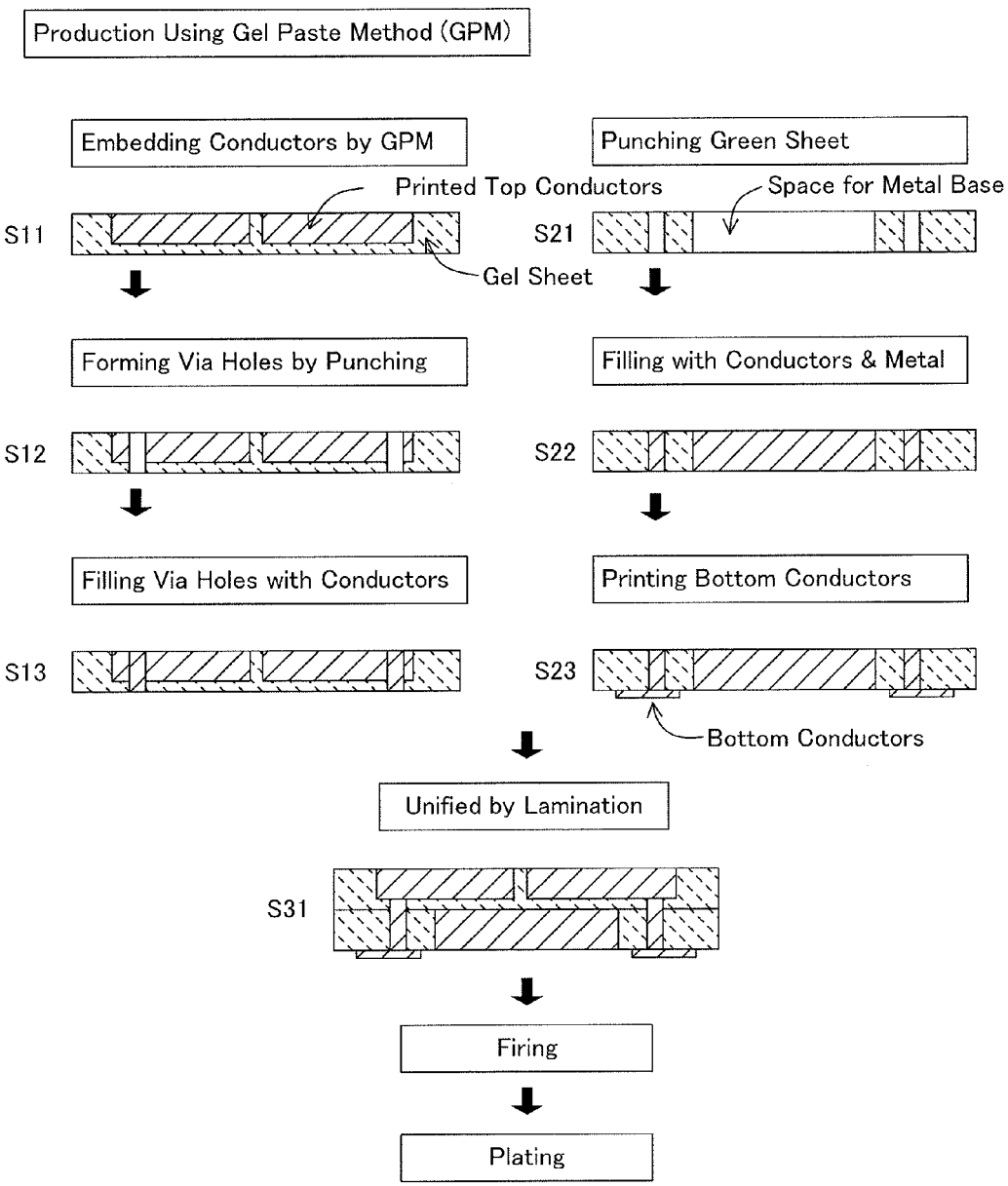
FIG. 1 is a schematic view showing an example of a production method of a substrate for a light-emitting diode according to one embodiment of the present invention.

As mentioned above, the present invention has one purpose to provide a substrate for a light-emitting diode which can show a high heat dissipation capacity by achieving a low thermal resistance as a total thermal resistance of a whole substrate, without reducing insulation reliability and high-humidity reliability of a substrate. As a result of a wholehearted investigation in order to attain the above-mentioned purpose, the present inventor has found out that, in a substrate for a light-emitting diode comprising a metal base with a thickness of a predetermined value or more, by configuring it so that the thickness of a top conductor for an electrical connection with a light-emitting diode (LED) falls within a predetermined range and the thickness of an insulation layer which electrically insulates a metal base and a top conductor and the thickness of the top conductor meet a predetermined relation to achieve a low thermal resistance as the total thermal resistance of the whole substrate, a high heat dissipation capacity can be shown without reducing insulation reliability and high-humidity reliability of the substrate, and has conceived the present invention.

Namely, the first embodiment of the present invention is,
a substrate for a light-emitting diode, comprising:
a metal base,
an insulation layer which comprises a dielectric material that mainly contains a ceramic and which is placed on at least one top of said metal base, and
a top conductor which is at least partially embedded within said insulation layer and at least partially exposed out of the top of said insulation layer on the side opposite to said metal base,
wherein:
the thickness (Tm) of said metal base in a thickness direction which is defined as a direction intersecting perpendicularly with said at least one top of said metal base is not less than 100 micrometers,
the thickness (Tc) of said top conductor in said thickness direction is not less than 20 micrometers and 100 micrometers or less, and
the thickness (Ti) of said insulation layer in said thickness direction and said thickness (Tc) of said top conductor in said thickness direction meet the relation expressed by a formula (1) shown below.

$$-40 \times Ti + 260 \leq Tc \leq -40 \times Ti + 1700 \qquad (1)$$

As mentioned above, a substrate for a light-emitting diode according to the present embodiment is,
a substrate for a light-emitting diode, comprising:
a metal base,
an insulation layer which comprises a dielectric material that mainly contains a ceramic and which is placed on at least one top of said metal base, and
a top conductor which is at least partially embedded within said insulation layer and at least partially exposed out of the top of said insulation layer on the side opposite to said metal base.

The above-mentioned metal base may be constituted by what kind of material as long as it is a material which has a higher thermal conductivity as compared with the above-mentioned insulation layer. As an example of such a metal base, for example, a metal base containing a metal which have a high thermal conductivity (for instance, metals, such as aluminum, copper, silver and tungsten, and alloys of any of these metals, etc.). Moreover, the above-mentioned metal base may be constituted by a material currently widely used in the art, for example, as a material which constitutes a heat slag or a heat spreader. Furthermore, ceramic powder which has a high thermal conductivity may be mixed into the material of the above-mentioned metal base. Thereby, when co-firing a metal base material, an insulation material and a top conductor, their behaviors accompanying the firing (for instance, a thermal expansion shrinkage behavior, etc.) can be matched as much as possible to make it easy to manufacture a substrate and improve the quality of the resulting substrate. As such a ceramic powder, aluminum nitride (AlN), silicon nitride ($Si_3N_4$), silicon carbide (SiC), alumina ($Al_2O_3$), copper oxide (CuO) and spinel system chemical compounds, etc. can be exemplified.

Moreover, the above-mentioned insulation layer is constituted by a dielectric material which mainly contains a ceramic. Such a ceramic can be suitably chosen from various ceramics currently widely used in the art, for example, for a dielectric material which constitutes a base material of a wiring substrate. In addition, the above-mentioned insulation layer is placed on at least one top of the above-mentioned metal base as mentioned above. Namely, the above-mentioned insulation layer may be laminated so as to cover at least one portion of one or more specific tops of the above-mentioned metal base. Alternatively, the above-mentioned metal base may be embedded inside of the above-mentioned insulation layer. In other words, the above-mentioned insulation layer is placed so as to intervene between the above-mentioned metal base and the above-mentioned top conductor so as to electrically insulate the above-mentioned metal base and the above-mentioned top conductor. As long as such requirements are satisfied, any of the tops of the above-mentioned metal base or its portion may be exposed at the top of the above-mentioned substrate.

Furthermore, it is desirable that the above-mentioned top conductor comprises a good conductor which has a small electrical resistance. Such a good conductor can be suitably chosen from various conductive materials currently widely used in the art for a conductive material which constitutes the electric circuit of such a circuit substrate. In addition, the above-mentioned top conductor is placed so as to be at least partially embedded within the above-mentioned insulation layer and at least partially exposed out of the top of the above-mentioned insulation layer on the side opposite to the above-mentioned metal base. Thereby, the above-mentioned top electrode can be electrically connected with an electrode (an anode electrode or cathode electrode) of an LED with a technique, such as a soldering, for example, when mounting the LED on the above-mentioned substrate. In addition, since the above-mentioned top electrode is at least partially embedded within the above-mentioned insulation layer, for example, a risk of a problem such that the top conductor may be detached from the substrate can be reduced even when a stress acts on the top conductor which connects the substrate and an LED element due to difference in thermal expansion shrinkage behaviors between these, in connection with the temperature change of the substrate in an implementation process of a package which contains the LED and in an operation period after completion of the package containing the LED, etc., for example.

In addition, as a matter of course, the above-mentioned top electrode may be connected with another conductive pattern for electrically connecting the above-mentioned substrate on which the LED is mounted with another wiring substrate which constitutes a package containing the LED, etc. Specifically, for example, the above-mentioned top electrode may be electrically connected with an electrode placed on the top on the side opposite to the top electrode of the above-mentioned substrate through a via electrode placed so as to penetrate the above-mentioned substrate.

The above-mentioned substrate may be manufactured by what kind of technique, as long as it is possible to constitute a conformation as mentioned above. For instance, a concrete method for manufacturing a substrate which has a conformation as mentioned above can be suitably chosen from various methods widely used in the art, for example, for a production method of a wiring substrate which adopts a base material comprising a dielectric material that mainly contains a ceramic. As a general example of such a method, what is called a "doctor blade method" and a "gel-casting method", etc., can be exemplified, for example.

When the former "doctor blade method" is adopted, the above-mentioned substrate can be manufactured, for example, by mixing raw powder containing a dielectric material and a sintering aid (such as glass), an organic binder, a plasticizing agent and a solvent, etc. to prepare a slurry, forming the resulting slurry into a sheet-like compact (green sheet) which has a desired thickness using a doctor-blade forming machine, punching the green sheet into a desired size, piercing an open via (through-hole) if needed, printing a paste containing a conductive material, such as silver, on the top of the green sheet (and inside of the via) using a technique, such as a screen printing, etc., for example, to place a conductive pattern, precisely accumulating a plurality of the resulting green sheets, laminating them through application of heat and pressure to unify them into a compact and firing the resulting compact.

On the other hand, when the above "gel-casting method" is adopted, the above-mentioned substrate can be manufactured, for example, by disposing a conductive pattern using a printing method, such as a screen printing, on the top of a protective backing material, for instance, in the shape of a film or a sheet, injecting a slurry of a dielectric material into the portion in which a conductive pattern was not placed, solidifying the slurry to obtain a sheet of the dielectric material in which the conductive pattern is placed thereon and/or embedded therein, laminating required numbers of the resulting sheets to constitute the conductive pattern as a top electrode and/or an inner-layer electrode, and firing a resulting compact.

In addition, for the above-mentioned protective backing material, it is desirable to use a resin film, such as a polyethylene terephthalate (PET) film and a polyethylene naphthalate (PEN) film, etc., and various materials in the shape of a film or a sheet, such as a glass plate, paper and a metal, besides a resin film. However, for a protective backing material, it is desirable to use a material with flexibility from a viewpoint of the ease of a peel-off operation.

Moreover, a remover etc. may be applied to the top of the above-mentioned protective backing material for the purpose of enabling it to easily peel off the sheet of the above-mentioned dielectric material from the protective backing material, for example. Such removers include various agents known as a release agent in the art, for example. More specifically, for such a remover, a well-known silicone series remover and a fluorine system remover, etc. can be used.

It is desirable that the above-mentioned conductive pattern is placed by forming a conductive paste which comprises, for example, at least one or more kinds of metals chosen from gold, silver and copper, etc. and a thermo-setting resin precursor for principal components on the top of the above-mentioned protective backing material using a method, such as a screen printing, for example. As for such a thermo-setting resin precursor, phenol resin, resole resin, urethane resin, epoxy resin and melamine resin, etc. can be used. Among these, phenol resin and resole resin are especially preferable. After printing such a conductive paste on the top of the above-mentioned protective backing material, a conductive pattern can be obtained by hardening a binder contained in this conductive paste.

As for the above-mentioned slurry of a dielectric material, for example, a slurry comprising a resin, ceramic powder, glass powder and a solvent can be exemplified. Here, the resin can function as what is called a "binder" and, for instance, thermo-setting resins, such as phenol resin, resole resin or polyurethane resin, or polyurethane precursors comprising polyol and polyisocyanate can be used. Among these, a thermo-setting resin precursor comprising polyol and polyisocyanate is especially preferable.

As for ceramic powder, any of an oxide system ceramic or a non-oxide system ceramic may be used. For instance, alumina ($Al_2O_3$), zirconia ($ZrO_2$), barium titanate ($BaTiO_3$), silicon nitride ($Si_3N_4$), silicon carbide (SiC), aluminum nitride (AlN), barium oxide (BaO), titanium oxide ($TiO_2$), silica ($SiO_2$), zinc oxide ($ZnO_2$) and neodymium oxide ($Nd_2O_3$), etc. can be used. As for glass powder, what comprises of various oxides can be used. Specifically, glass consisting of two or more kinds of components suitably chosen from zinc oxide (ZnO), barium oxide (BaO), boron oxide ($B_2O_3$), silicon oxide ($SiO_2$), magnesium oxide (MgO), aluminum oxide ($Al_2O_3$) and calcium oxide (CaO), and oxides of alkali metals, etc. can be used. Moreover, only one kind of these materials may be used alone, or two or more kinds may be used in combination. Furthermore, as long as a slurry can be prepared, the particle diameters of the ceramic powder and the glass powder are not limited in particular.

Moreover, the above-mentioned solvents are not especially limited, as long as it can dissolve a resin as the above-mentioned binder (and a dispersant, if used). As a concrete example of a solvent, for example, solvent which has two or more ester bonds in the molecule, such as polybasic-acid esters (for instance, dimethyl glutarate, etc.) and acid esters of polyvalent alcohol (for instance, triacetin (glyceryl triacetate), etc.), etc., can be exemplified.

Furthermore, the slurry of the above-mentioned dielectric material may contain a dispersant in addition to the above-mentioned resin, ceramic powder and solvent. As an example of a dispersant, for example, polycarboxylic-acid system copolymers, polycarboxylate, etc. can be exemplified. By adding such a dispersant, low viscosity and high fluidity can be imparted to the slurry before forming.

A compact thus obtained is fired (co-fired) at a predetermined temperature for a predetermined period under a predetermined circumstance, and a fired object of the compact is obtained. In addition, a "gel-casting method" as mentioned above may be referred to as a "gel slurry casting method", etc. (for instance, refer to PTL 3). In addition, the contents of the disclosures in the prior art literatures are incorporated into this specification by reference.

In addition, as for a method for forming a sheet of a dielectric material with a conductive pattern embedded therein, which is obtained by injecting a slurry of a dielectric material into the portion, on which a conductive pattern was not placed, of a protective backing material with the conductive pattern placed on the top as mentioned above and hardening the slurry, a dispenser method and a spin coat method, etc. can be adopted besides the above, for example. Furthermore, what is called a "gel paste method" can be also adopted as such a method.

Specifically, a method in which a base (base with a conductive pattern formed on its top) is placed between a pair of guide plates, a ceramic slurry is coated on the base to cover the conductive pattern with the ceramic slurry, and thereafter, for instance, a blade-like jig is slid on the upper top of the above-mentioned pair of guide plates to remove (strickle) an excessive ceramic slurry, can be adopted. In this method, the thickness of a ceramic slurry can be easily adjusted by adjusting the height of the pair of guides (for instance, refer to PTL 4. In addition, the content of the disclosure in this prior art literature is incorporated into this specification by reference.

By the way, as mentioned in the beginning, in a substrate on which a light-emitting diode (LED) is mounted (substrate for a light-emitting diode), it is desirable to suppress decrease in an energy efficiency resulting from the temperature-rise of the LED by efficiently releasing the heat which is generated in association with light emission of the LED and preventing the temperature-rise of the LED. The above-mentioned metal base is included as one of the components which constitute the substrate for a light-emitting diode according to the present embodiment for such a purpose.

In addition, the above-mentioned metal base comprises, for example, a metal which has a high thermal conductivity (for instance, such as aluminum, copper, silver and tungsten, and alloys of any of these metals, etc.), as mentioned above. Thereby, the above-mentioned metal base can transmit efficiently the heat which is generated in association with light emission of the LED and can release it to the exterior of the substrate. In order to sufficiently show such an effect, it is desirable that the thickness (dimension in a direction which intersects perpendicularly with a principal plane of the substrate) of the above-mentioned metal base is large. Therefore, also as for the metal base which the substrate for a light-emitting diode according to the present embodiment comprises, it is desirable that the thickness (dimension in a direction which intersects perpendicularly with a principal plane of the substrate) of the metal base is large. Specifically, it is desirable that the thickness (dimension in a direction which intersects perpendicularly with a principal plane of the substrate) of the above-mentioned metal base is not less than 100 micrometers.

Therefore, as mentioned above, in the substrate for a light-emitting diode according to the present embodiment, the thickness (Tm) of said metal base in a thickness direction which is defined as a direction intersecting perpendicularly with said at least one top of said metal base is not less than 100 micrometers. Thereby, in the substrate for a light-emitting diode according to the present embodiment, the thick metal base can more efficiently conduct the heat, which is generated in association with light emission of the LED, toward the principal plane of the substrate on the side opposite to the side on which the LED is placed and perform an efficient thermal conduction is possible also in a direction parallel to the principal plane (in-plane direction). As a result, the heat which is generated in association with light emission of the LED can be transmitted and diffused efficiently in the substrate, and can be released efficiently to the exterior of the substrate, for instance, through the principal plane on the side opposite to the side on which the LED is placed of the substrate, etc. In addition, more preferably, it is desirable that the thickness (Tm) of the above-mentioned metal base is not less than 150 micrometers.

By the way, as mentioned above, from a viewpoint of securing insulation reliability of a substrate, it is desirable that the thicknesses of a metal base which efficiently conducts heat, which is generated in association with light emission of an LED, within a substrate and an insulation layer for electrically insulating a top conductor which establishes an electrical connection between the substrate and the LED are large. However, the more the thickness of the insulation layer increases, the more a total thermal resistance of the whole substrate increases and a total heat dissipation capacity of the whole substrate falls, due to a relatively low thermal conductivity which the insulation layer has. In addition, there is a possibility that various problems resulting from a difference in thermal expansion shrinkage behavior between the dielectric material constituting the insulation layer (in the present embodiment, the dielectric material mainly comprising a ceramic) and the material constituting the metal base and the top conductor (for instance, a metal, etc.) (for instance, an occurrence of a fissure (crack) in the insulation layer in connection with the temperature change of the substrate, in a manufacturing process of the substrate, in an implementation process of a package which contains the LED, and in an operation period after completion of the package containing the LED, etc.) may occur to cause a problem, such as reduction of reliability of the substrate under a high-humidity environment (high-humidity reliability). Moreover, the larger the thickness of the metal base is, the more such a concern becomes noticeable. Especially, in the substrate according to the present embodiment, in which a ceramic is adopted as the dielectric material which constitutes the insulation layer, a concern as mentioned above becomes more noticeable when the substrate is manufactured by co-firing such insulation layer with the metal base and the top conductor.

Therefore, in order to show a high heat dissipation capacity by achieving a low thermal resistance as the total thermal resistance of the whole substrate without reducing the insulation reliability and high-humidity reliability of the substrate in the substrate for a light-emitting diode according to the present embodiment comprising a thick metal base thick as mentioned above, it is important to reduce a concern as mentioned above. Then, as mentioned above, as a result of a wholehearted investigation, the present inventor has found out that, in a substrate for a light-emitting diode comprising a metal base with a thickness of a predetermined value or more, by configuring it so that the thickness of a top conductor for an electrical connection with a light-emitting diode (LED) falls within a predetermined range and the thickness of an insulation layer which electrically insulates a metal base and a top conductor and the thickness of the top conductor meet a predetermined relation to achieve a low thermal resistance as the total thermal resistance of the whole substrate, a high heat dissipation capacity can be shown without reducing insulation reliability and high-humidity reliability of the substrate.

Specifically, as for the thickness (Tc) of the top conductor in the substrate for a light-emitting diode according to the present embodiment comprising the metal base which has a thickness of not less than 100 micrometers, a lower limit (for instance, 5 micrometers) exists naturally, from viewpoints of a soldering property with an LED and a bonding strength with a substrate, etc., for example. However, the present inventor has found out that an effect to reduce a total thermal resistance of a whole substrate appears more noticeably when the thickness (Tc) of the top conductor is not less than 20 micrometers. More preferably, it is desirable that the thickness (Tc) of the top conductor in the substrate for a light-emitting diode according to the present embodiment is not less than 30 micrometers.

On the other hand, as mentioned above, from a viewpoint of reducing various problems resulting from the difference in a thermal expansion shrinkage behavior between a dielectric material (mainly ceramic) which constitutes an insulation layer and a material which constitutes a metal base and a top conductor (for instance, an occurrence of a fissure (crack) in the insulation layer in connection with the temperature change of the substrate, etc.), there is also an upper limit in the thickness (Tc) of the top conductor in the substrate for a light-emitting diode according to the present embodiment. Specifically, the thickness (Tc) of the top conductor in the substrate for a light-emitting diode according to the present embodiment is 100 micrometers or less. Thereby, a concern as mentioned above is prevented from increasing. More preferably, it is desirable that the thickness (Tc) of the top conductor in the substrate for a light-emitting diode according to the present embodiment is 75 micrometers or less.

Namely, in the substrate for a light-emitting diode according to the present embodiment, as mentioned above, the thickness (Tc) of said top conductor in said thickness direction is not less than 20 micrometers and 100 micrometers or less.

Moreover, as mentioned above, an obstacle in a further improvement in a heat dissipation capacity of a substrate resulting from a relatively low thermal conductivity which an insulation layer has can be relieved by reducing the thickness (Ti) of an insulation layer (for instance, refer to PTL 2). However, when the total thermal resistance of the whole substrate is going to be reduced by reducing the thickness (Ti) of the insulation layer, there is a possibility of causing reduction of insulation reliability in the substrate. Specifically, there is a possibility that it may become difficult to secure an electric insulation between the top conductor and the metal base in association with reduction of the thickness (Ti) of the insulation layer and, for instance, an electrical short (short-circuit) of the top conductors through the metal base (an electrical short of other conductive patterns or an electrical short of the top conductor and another conductive pattern when the substrate comprises conductive patterns other than the top conductor) may be caused. Thus, a lower limit naturally exists in the thickness (Ti) of an insulation layer from a viewpoint of securing insulation reliability in a substrate. On the contrary, the larger the thickness (Ti) of an insulation layer becomes, the more the total thermal resistance of the whole substrate increases, and therefore an upper limit also exists in the thickness (Ti) of an insulation layer.

However, as a result of a wholehearted investigation, the present inventor has found out that the lower and upper limits of thickness (Ti) of an insulation layer as mentioned above is not determined independently regardless of other components, but these lower and upper limits have a specific relation with the thickness (Tc) of a top conductor. Specifically in the substrate for a light-emitting diode according to the present embodiment, the thickness (Ti) of said insulation layer in said thickness direction and said thickness (Tc) of said top conductor in said thickness direction meet a relation expressed by a formula (1) shown below.

$$-40 \times Ti + 260 \leq Tc \leq -40 \times Ti + 1700 \quad (1)$$

In the substrate for a light-emitting diode according to the present embodiment, a high heat dissipation capacity can be shown without reducing insulation reliability and high-humidity reliability of the substrate, by configuring the thickness (Ti) of an insulation layer and the thickness (Tc) of a top conductor so as to meet the above-mentioned relational expression to achieve a low thermal resistance as the total thermal resistance of the whole substrate. As a result, in accordance with the substrate for a light-emitting diode according to the present embodiment, reduction of the energy efficiency of the LED due to the temperature-rise of the LED by heat generation accompanying light emission of the LED can be suppressed without reducing the insulation reliability and high-humidity reliability of a package containing the LED.

By the way, as mentioned above, the top conductor which the substrate for a light-emitting diode according to the present embodiment comprises is at least partially embedded within said insulation layer and at least partially exposed out of the top of said insulation layer on the side opposite to said metal base. Thus, in the substrate for a light-emitting diode according to the present embodiment, since the top conductor is at least partially embedded within the insulation layer, for example, a risk of a problem such that the top conductor may be detached from the substrate can be reduced even when a stress acts on the top conductor which connects the substrate and an LED element due to difference in thermal expansion shrinkage behaviors between these, in connection with the temperature change of the substrate in an implementation process of a package which contains the LED and in an operation period after completion of the package containing the LED, etc., for example.

In order to show such an effect, it is desirable that the top conductor is embedded within the insulation layer deeply enough. In other words, it is desirable that the thickness of the portion of the top conductor, which is embedded within the insulation layer, is large sufficiently. Specifically, in the substrate for a light-emitting diode according to the present embodiment, it is desirable that the maximum value of the thickness of the portion, which is embedded within the insulation layer, of the top conductor is not less than 10 micrometers.

Therefore, the second embodiment of the present invention is, the substrate for a light-emitting diode according to said first embodiment of the present invention, wherein:

the maximum value (Tbmax) of the thickness (Tb) of the portion of said top conductor embedded within said insulation layer in said thickness direction is not less than 10 micrometers.

As mentioned above, in the substrate for a light-emitting diode according to the present embodiment, the maximum value (Tbmax) of the thickness (Tb) of the portion of said top conductor embedded within said insulation layer in said thickness direction is not less than 10 micrometers. In other words, the top conductor which the substrate for a light-emitting diode according to the present embodiment comprises is embedded within the insulation layer at a depth of not less than 10 micrometers. Thereby, in accordance with the substrate for a light-emitting diode according to the present embodiment, a risk of a problem such that the top conductor may be detached from the substrate can be more certainly reduced even when a stress acts on the top conductor which connects the substrate and an LED element due to difference in thermal expansion shrinkage behaviors between these, in connection with the temperature change as mentioned above, for example.

More preferably, it is desirable that one half or more of the top conductor which the substrate for a light-emitting diode according to the present embodiment comprises is embedded within the insulation layer. In other words, it is more desirable that the top conductor which the substrate for a light-emitting diode according to the present embodiment comprises is embedded within the insulation layer at a depth of one half (½) or more of the thickness (Tc) of the top conductor.

Therefore, the third embodiment of the present invention is, the substrate for a light-emitting diode according to said second embodiment of the present invention, wherein:

the maximum value (Tbmax) of the thickness (Tb) of the portion of said top conductor embedded within said insulation layer in said thickness direction is ½ (one half) or more of the thickness (Tc) of said top conductor in said thickness direction.

As mentioned above, in the substrate for a light-emitting diode according to the present embodiment, the maximum value (Tbmax) of the thickness (Tb) of the portion of said top conductor embedded within said insulation layer in said thickness direction is ½ (one half) or more of the thickness (Tc) of said top conductor in said thickness direction. In other words, a half or more in its thickness direction of the top conductor which the substrate for a light-emitting diode according to the present embodiment comprises is embedded within the insulation layer. Thereby, in accordance with the substrate for a light-emitting diode according to the present embodiment, a risk of a problem such that the top conductor may be detached from the substrate can be furthermore certainly reduced even when a stress acts on the top conductor which connects the substrate and an LED element due to difference in thermal expansion shrinkage behaviors between these, in connection with the temperature change as mentioned above, for example.

By the way, while two electrodes (an anode electrode and a cathode electrode) of an LED may be respectively placed on different surfaces (for instance, surfaces facing toward the opposite side mutually) of an LED element, both of the two electrodes may be placed on the same surface of an LED element. In the latter case, the top conductor which the substrate for a light-emitting diode according to the present embodiment comprises needs to be configured so as to separately establish an electrical connection with respective one of the two electrodes (an anode electrode and a cathode electrode) of the LED. Therefore, the top conductor which the substrate for a light-emitting diode according to the present embodiment comprises may be divided into at least two or more regions.

Therefore, the fourth embodiment of the present invention is, the substrate for a light-emitting diode according to any one of said first to third embodiments of the present invention, wherein:

said top conductor is divided into at least two or more regions.

As mentioned above, the above-mentioned top conductor is divided into at least two or more regions in the substrate for a light-emitting diode according to the present embodiment. Thereby, even when both of two electrodes (an anode electrode and a cathode electrode) of an LED are placed on the same surface of an LED element as mentioned above, an electrical connection can be established separately with respective one of these two electrodes, for example. Although an embodiment wherein the top conductor which the substrate for a light-emitting diode according to the present embodiment comprises is divided into at least two or more regions and these regions establish an electrical connection separately with respective one of these two electrodes of the LED was exemplified in the above-mentioned explanation, it should be noted that the present embodiment does not exclude a type of usage wherein the top conductor which the substrate for a light-emitting diode according to the present embodiment comprises is divided into at least two or more regions and these regions are electrically connected with either of the two electrodes of the LED.

By the way, in the substrate for a light-emitting diode according to the present embodiment, as mentioned above, said top conductor is divided into at least two or more regions. Therefore, for example, an air gap between these two or more regions may be filled with an insulation material (dielectric material) for the purpose of improving insulation reliability between these two or more regions, etc.

Namely, the fifth embodiment of the present invention is, the substrate for a light-emitting diode according to said fourth embodiment of the present invention, wherein:

a dielectric material fills a gap between said at least two or more regions of said top conductor.

As mentioned above, in the substrate for a light-emitting diode according to the present embodiment, a dielectric material fills a gap between said at least two or more regions of said top conductor. Thereby, in the substrate for a light-emitting diode according to the present embodiment, insulation reliability between two or more regions of the top conductor divided into at least two or more regions can be improved, for example. In addition, a dielectric material which fills a gap between these two or more regions is not limited in particular, and can be chosen suitably from various materials widely used in the art as a packing material, etc., depending on a usage environment of the substrate, etc. Alternatively, the dielectric material may be the same material as the dielectric material which constitutes the insulation layer that the substrate for a light-emitting diode according to the present embodiment comprises.

In accordance with the substrate for a light-emitting diode according to the present invention including various embodiments which have been explained above, a high heat dissipation capacity can be shown by achieving a low thermal resistance as the total thermal resistance of the whole substrate, without reducing the insulation reliability and high-humidity reliability of the substrate. As a result, reduction of the energy efficiency of the LED due to the temperature-rise of the LED by heat generation accompanying light emission of the LED can be suppressed without reducing the insulation reliability and high-humidity reliability of a package containing the LED.

Hereinafter, substrates for a light-emitting diode according to some embodiments of the present invention will be explained in more detail. However, the following explanations are absolutely intended for exemplification, and the scope of the present invention should not be interpreted to be limited to the following explanations.

EXAMPLE

1. Production Method of Substrate for Light-Emitting Diode (1) Production Method of Substrate for Light-Emitting Diode Using Gel Paste Method First, as one example of a production method of a substrate for a light-emitting diode according to the present invention, a production method of a substrate for a light-emitting diode using a gel paste method as mentioned above will be explained below referring to accompanying drawings. FIG. 1 is a schematic view showing an example of a production method of a substrate for a light-emitting diode according to one embodiment of the present invention, as mentioned above. As shown in FIG. 1, in the production method according to this working example, a gel sheet within which a top conductor with a predetermined thickness is embedded was prepared. Specifically, first, in step S11, a protective backing material with a conductive pattern formed on its top was placed between a pair of guide plates (not shown), a ceramic slurry (paste-like slurry) was coated on the protective backing material to cover the conductive pattern with the ceramic slurry, and thereafter, for instance, a blade-like jig was slid on the upper top of the above-mentioned pair of guide plates to remove (strickle) an excessive ceramic slurry. Thereby, a gel sheet within which a top conductor is embedded was prepared. In addition, in this working example, one principal plane of the top conductor was constituted so that the surface of the top conductor and the surface of the gel sheet exist and exposed at an identical plane in one principal plane of the gel sheet (i.e., so as to be a "flush surface").

Next, in step S12, a via hole for disposing a via conductor used in order to electrically connect a top conductor and a bottom conductor later was formed by a punching processing. Furthermore, in step S13, the via hole formed as mentioned above was filled with a conductive paste by a printing method. In this working example, the resulting gel sheet is referred to as a "front side gel sheet."

On the other hand, in step S21, a green sheet of a dielectric material was punched to form a through-hole and a via hole for disposing a metal base and a via conductor. Next, in step S22, the above-mentioned through-hole and via hole were filled with a metal base material (for instance, a mixture of copper powder and aluminum-nitride powder, silver, etc.) and a conductive paste, respectively. In addition, in this working example, in step S23, the bottom conductor for connecting the substrate to a printed board, etc. was placed on one principal plane (back) of the green sheet by a printing methods (for instance, a screen printing, etc.) so as to be connected with the above-mentioned via conductor. In this working example, the resulting green sheet is referred to as a "back side green sheet."

Finally, in step S31, the above-mentioned front side gel sheet and the above-mentioned back side green sheet were laminated so that the principal plane on the side, on which the top conductor was not exposed, of the above-mentioned front side gel sheet and the principal plane on the side, on which the bottom conductor was not formed, of the above-mentioned back side green sheet contacted. In addition, at the time of lamination, the via conductors respectively exposed on the mutually-opposing principal planes of the above-mentioned front side gel sheet and the above-mentioned back side green sheet needed to contact with each other in a status in which an electrical conduction was possible. Therefore, the via conductor formed in the above-mentioned steps S21 and S22 and the via conductor extending from the top conductor formed in the above-mentioned steps S12 and S13 were placed at a location where they were in a status in which an electrical conduction is mutually possible when the above-mentioned front side gel sheet and the above-mentioned back side green sheet were laminated (specifically, these via conductors were placed at the same location in a projection plane parallel to the principal plane of the substrate).

Thereafter, by firing as a unit (co-firing) a laminated object of the above-mentioned front side gel sheet and the above-mentioned back side green sheet obtained as the above, a substrate for a light-emitting diode according to one embodiment of the present invention constituted so that the exposed surface of the top conductor and the principal plane of the substrate exist in an identical plane (i.e., so as to be a "flush surface") can be manufactured. As an example of the configuration of the substrate for a light-emitting diode according to one embodiment of the present invention thus constituted so that the exposed surface of the top conductor and the principal plane of the substrate exist in an identical plane, the configurations shown in FIG. 3 and FIG. 4 can be exemplified, for example. However, as a person skilled in the art can easily understand, a substrate manufactured by a production method of a substrate for a light-emitting diode using a gel paste method is not limited to the substrate constituted so that the exposed surface of the top conductor and the principal plane of the substrate exist in an identical plane as mentioned above, and it is needless to say that it is also possible to manufacture a substrate constituted so that a top conductor projects from the principal plane of the substrate as mentioned later by a production method of a substrate for a light-emitting diode using a gel paste method.

Figure 2:
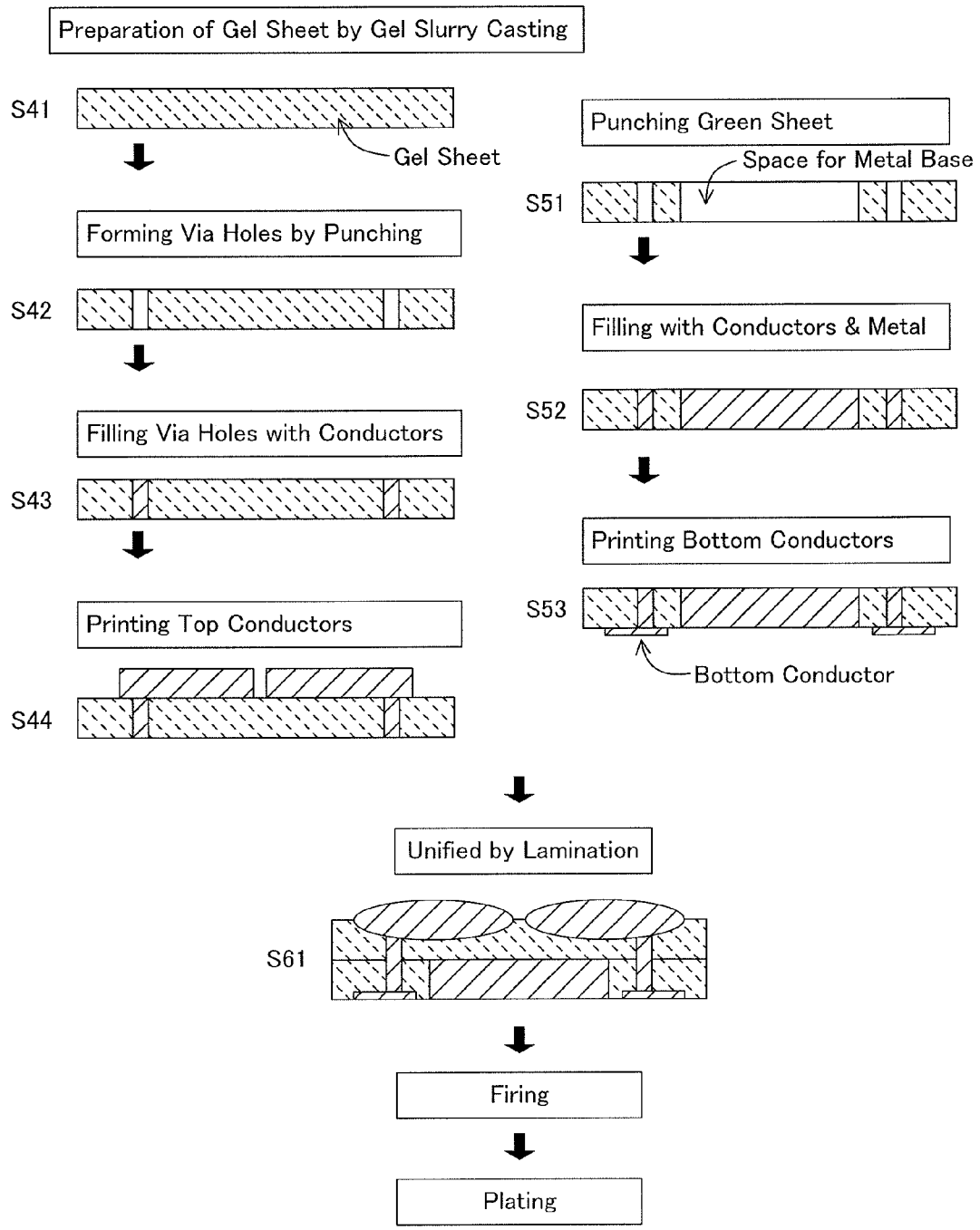
FIG. 2 is a schematic view showing an example of a production method of a substrate for a light-emitting diode according to another embodiment of the present invention.

(2) Production Method of Substrate for Light-Emitting Diode Using Gel Slurry Casting Method First, as another example of a production method of a substrate for a light-emitting diode according to the present invention, a production method of a substrate for a light-emitting diode using a gel slurry casting method will be explained below referring to accompanying drawings. FIG. 2 is a schematic view showing an example of a production method of a substrate for a light-emitting diode according to another embodiment of the present invention, as mentioned above. As shown in FIG. 2, in the production method according to this working example, a gel sheet with a top conductor partially embedded therein was prepared using a gel sheet formed by a gel slurry casting method.

Specifically, first, in step S41, a gel sheet was prepared by a gel slurry casting method and then, in step S42, the above-mentioned gel sheet was punched to form a via hole for disposing a via conductor used in order to electrically connect a top conductor and a bottom conductor later. Subsequently, in step S43, the via hole formed as the above was filled with a conductive paste by a printing method. Furthermore, in step S44, on one principal plane of the gel sheet which had the via hole filled with the conductive paste which would become a via conductor as mentioned above, a conductive paste which would become a top conductor was printed so as to connect with the via conductor. In this working example, the resulting gel sheet is referred to as a "front side gel sheet."

On the other hand, in step S51, the gel sheet of a dielectric material prepared by the gel slurry casting method was punched to form a through-hole and a via hole for disposing a metal base and a via conductor. Next, in step S52, the above-mentioned through-hole and via hole were filled with a metal base material (for instance, a mixture of copper powder and aluminum-nitride powder, silver, etc.) and a conductive paste, respectively. In addition, in this working example, in step S53, the bottom conductor for connecting the substrate to a printed board, etc. was placed on one principal plane (back) of the gel sheet by a printing methods (for instance, a screen printing, etc.) so as to be connected with the above-mentioned via conductor. In this working example, the resulting gel sheet is referred to as a "back side gel sheet."

Finally, in step S61, the above-mentioned front side gel sheet and the above-mentioned back side gel sheet were laminated so that the principal plane on the side, on which the top conductor was not exposed, of the above-mentioned front side gel sheet and the principal plane on the side, on which the bottom conductor was not formed, of the above-mentioned back side green sheet contacted. In addition, by a pressure at the time of lamination in step S61, while the top conductor formed in the above-mentioned step S44 is embedded inside of the gel sheet, the shape thereof deforms and becomes no longer the shape (rectangle) at the time of formation. Thereafter, when a lamination pressure was released, a portion of the top conductors embedded inside of the gel sheet projected from the surface of the gel sheet, and became a shape as shown in step S61.

In addition, at the time of lamination, the via conductors respectively exposed on the mutually-opposing principal planes of the above-mentioned front side gel sheet and the above-mentioned back side gel sheet needed to contact with each other in a status in which an electrical conduction was possible. Therefore, the via conductor formed in the above-mentioned steps S51 and S52 and the via conductor extending from the top conductor formed in the above-mentioned steps S42 and S43 were placed at a location where they were in a status in which an electrical conduction is mutually possible when the above-mentioned front side gel sheet and the above-mentioned back side gel sheet were laminated (specifically, these via conductors were placed at the same location in a projection plane parallel to the principal plane of the substrate).

Figure 5:
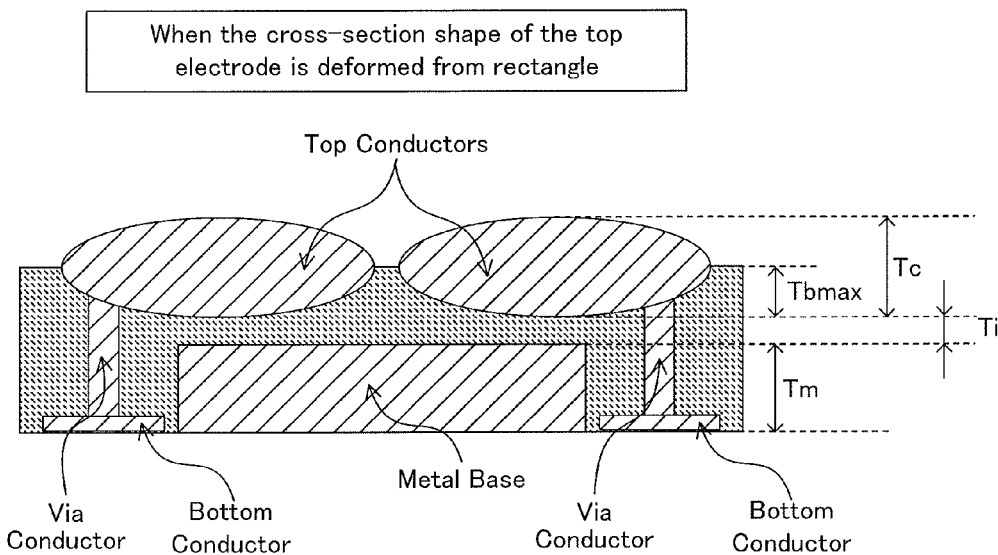
FIG. 5 is a schematic view showing an example of a configuration of a substrate for a light-emitting diode according to further another embodiment of the present invention.

Thereafter, by firing as a unit (co-firing) a laminated object of the above-mentioned front side gel sheet and the above-mentioned back side gel sheet obtained as the above, a substrate for a light-emitting diode according to one embodiment of the present invention constituted so that the top conductor is at least partially embedded within the insulation layer and at least partially exposed out of the insulation layer on the side opposite to the above-mentioned metal base of the substrate (i.e., so that the top conductor projects from the principal plane of the substrate) can be manufactured. As an example of the configuration of the substrate for a light-emitting diode according to one embodiment of the present invention thus constituted so that the top conductor is at least partially embedded within the insulation layer and at least partially exposed out of the insulation layer, the configuration shown in FIG. 5 can be exemplified, for example. However, as a person skilled in the art can easily understand, a substrate manufactured by a production method of a substrate for a light-emitting diode using a gel paste method is not limited to the substrate constituted so that the top conductor is at least partially embedded within the insulation layer and at least partially exposed out of the insulation layer as mentioned above, and it is needless to say that it is also possible to manufacture a substrate constituted so that the exposed surface of the top conductor and the principal plane of the substrate exist in an identical plane (i.e., so as to be a "flush surface") as mentioned above, by a production method of a substrate for a light-emitting diode using a gel slurry casting method.

In addition, in the substrate for a light-emitting diode according to this working example, the top conductor is divided into two regions at the top of the substrate, and each region is partially embedded and partially exposed. Therefore, in the portion exposed from the top of the substrate, an air gap (gap) will arise between the two regions of the top conductor. By filling the gap with a dielectric material, reliability of insulation between the two regions of the top conductor can be improved. In addition, the dielectric material which fills a gap between these two regions is not limited in particular, and can be chosen suitably from various materials widely used in the art as a packing material, etc., depending on a usage environment of the substrate, etc. Alternatively, the dielectric material may be the same material as the dielectric material which constitutes the insulation layer that the substrate for a light-emitting diode according to the present embodiment comprises.

In addition, a plating process may be executed on the substrate manufactured in any of step S31 and step S61 after a firing process to plate the surface of the top conductor and the bottom conductor. Moreover, the above is absolutely just an exemplification, and it should not be interpreted that a production method of a substrate for a light-emitting diode according to the present invention is limited to the above.

2. Valuation of Various Sample Substrates (1)

Figure 3:
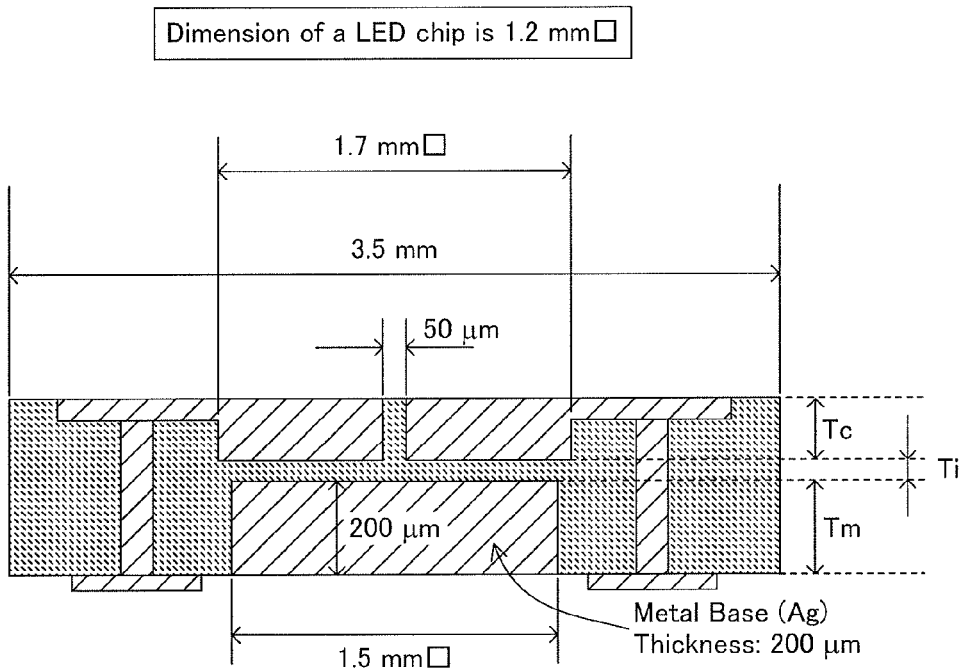
FIG. 3 is a schematic view showing an example of a configuration of a substrate for a light-emitting diode according to one embodiment of the present invention.

By the above-mentioned production method, various samples for a valuation of the substrate for a light-emitting diode which have various combinations of the thickness (Tc) of a top conductor and the thickness (Ti) of an insulation layer were manufactured. Here, the various samples for a valuation of the substrate for a light-emitting diode according to this working example will be explained, referring to an accompanying drawing. FIG. 3 is a schematic view showing an example of a configuration of a substrate for a light-emitting diode according to one embodiment of the present invention, as mentioned above. As shown in FIG. 3, the "thickness" of each component member which constitutes the substrate for a light-emitting diode according to this working example is a term which refers to the dimension of each component member in a direction in which a metal base, an insulation layer and a top conductor are laminated (namely, a direction perpendicular to the interface between these component members). In other words, the "thickness direction" in the substrate for a light-emitting diode according to this working example is defined as a direction which intersects perpendicularly with the top of a metal base as an interface between an insulation layer, with which a top conductor is laminated, and a metal base.

In addition, when various samples for a valuation of the substrate for a light-emitting diode which had various combinations of the thickness (Tc) of a top conductor and the thickness (Ti) of an insulation layer were evaluated in this working example, a metal base was constituted by a material which comprised silver (Ag) as a principal component, the thickness thereof was constant at 200 micrometers, and the dimension was 1.5 mm square according to the dimension of an LED (1.2 mm square), as shown in FIG. 3, in all the samples. Moreover, the dimension of the substrate was 3.5 mm square, and the gap between two regions of a top conductor was 50 micrometers. Furthermore, as a top conductor which had the thickness meeting the requirements for the present invention, a top conductor with a dimension of 1.7 mm square was placed at a location opposing to the above-mentioned metal base in the thickness direction of the substrate. In addition, since the area of the top conductor was mostly equal to the area of the metal base in this working example, a via conductor for electrically connecting the top conductor and the bottom conductor was placed at a location where the metal base did not exist (in a projection to a plane parallel to the principal plane of the substrate), and the in-plane conductor electrically connecting such a via conductor and the above-mentioned top conductor was further placed.

Under the conditions as mentioned above, various samples for a valuation of the substrate for a light-emitting diode with the thickness (Tc) of a top conductor and the thickness (Ti) of an insulation layer variously changed as shown in the following Table 1 and Table 2 were manufactured, and the influences of the thickness (Tc) of the top conductor and the thickness (Ti) of the insulation layer on the electric insulation (existence or non-existence of an electrical short) of the whole substrate, the occurrence of a crack in the insulation layer after a heat cycle test (H/C), and the thermal resistance were investigated. The results of such valuations will be explained in detail below.

In addition, as for the electric insulation of the whole substrate, the existence or non-existence of an electrical short between the top conductor and the metal base was inspected after manufacturing the various samples for a valuation of the substrate for a light-emitting diode, and the one in which an electrical short was observed was judged as "poor" and the one in which no electrical short was observed was judged as "good". Moreover, as for the occurrence of a crack in the insulation layer after a heat cycle test, each of the various samples for a valuation of the substrate for a light-emitting diode manufactured as mentioned above was subjected to a cycle, in which the temperature was raised from −40° C. to 150° C. for 5 minutes after holding at 40° C. for 30 minutes, and the temperature was lowered from 150° C. to −40° C. for 5 minutes after holding at 150° C. for 30 minutes, 500 times, respectively, and thereafter the substrates were immersed in molten solder to dissolve the top conductor containing, for instance, copper (Cu) or silver (Ag), etc. and remove the top conductor, and the existence or non-existence of the occurrence of a crack in the insulation layer was investigated by a red-check inspection. Furthermore, the thermal resistance was measured in conformity to the electronic circuit board test method for a high-intensity LED of JPCA (Japan Electronics Packaging and Circuits Association).

(a) Relation Between Thickness (Tc) of Top Conductor and Thickness (Ti) of Insulation Layer In this working example, first, the influences of the combination of the thickness (Tc) of a top conductor and the thickness (Ti) of an insulation layer on an electric insulation and an occurrence of a crack accompanying a heat cycle test were investigated. The combinations of the thickness (Tc) of a top conductor and the thickness (Ti) of an insulation layer in the various samples for a valuation, and the evaluation results about the electric insulation and the occurrence of a crack accompanying a heat cycle test are enumerated in the following Table 1.

TABLE 1

| | Tc [μm] | Ti [μm] | Electric Insulation | Crack after H/C | Overall Valuation |
|---|---|---|---|---|---|
| WE 1P-1 | 20 | 6 | Good | None | Good |
| WE 1P-2 | 60 | 5 | Good | None | Good |
| WE 1P-3 | 80 | 4.5 | Good | None | Good |
| WE 1P-4 | 100 | 4 | Good | None | Good |
| WE 1P-5 | 20 | 42 | Good | None | Good |
| WE 1P-6 | 60 | 41 | Good | None | Good |
| WE 1P-7 | 80 | 40.5 | Good | None | Good |
| WE 1P-8 | 100 | 40 | Good | None | Good |
| CE 1P-1 | 20 | 5 | Poor | None | Poor |
| CE 1P-2 | 60 | 4 | Poor | None | Poor |
| CE 1P-3 | 80 | 4 | Poor | None | Poor |
| CE 1P-4 | 100 | 3 | Poor | None | Poor |
| CE 1P-5 | 20 | 44 | Good | Exist | Poor |
| CE 1P-6 | 60 | 43 | Good | Exist | Poor |
| CE 1P-7 | 80 | 43 | Good | Exist | Poor |
| CE 1P-8 | 100 | 42 | Good | Exist | Poor |

As apparent from the results in Table 1, it turns out that the thickness (Ti) of an insulation layer needs to fall within a specific range in order to attain a good electric insulation and suppress the occurrence of a crack accompanying a heat cycle test, even if the thickness (Tc) of the top conductor falls within a suitable range in the present invention (not less than 20 micrometers, 100 micrometers or less). However, a good evaluation result was not obtained only by the thickness (Ti) of the insulation layer falling within a specific range, but it was observed that the upper limit and lower limit of the suitable range of the thickness (Ti) of an insulation layer change corresponding to the thickness (Tc) of a top conductor.

Specifically, even if the thickness (Ti) of an insulation layer is constant at 5 micrometers, while there is a problem in neither an electric insulation nor an occurrence of a crack and therefore it is judged as "good" when the thickness (Tc) of a top conductor is 60 micrometers (Working Example (WE) 1P-2), an electric insulation is judged as "poor" when the thickness (Tc) of a top conductor is 20 micrometers (Comparative Example (CE) 1P-1). Moreover, even if the thickness (Ti) of an insulation layer is constant at 42 micrometers, while it is judged as "good" when the thickness (Tc) of a top conductor is 20 micrometers (WE 1P-5), an occurrence of a crack accompanying a heat cycle test was observed when the thickness (Tc) of a top conductor was 100 micrometers (CE 1P-8).

Then, from a relation between various combinations of the thickness (Tc) of a top conductor and the thickness (Ti) of an insulation layer and the evaluation results about the corresponding samples for a valuation, it was found out that, in the substrate in which the thickness (Tm) of a metal base is not less than 100 micrometers, a good result in both of an electric insulation and occurrence of a crack accompanying a heat cycle test can be obtained when the thickness (Ti) of an insulation layer and the thickness (Tc) of a top conductor meet the relation expressed by the formula (1) shown below.

$$-40 \times Ti + 260 \leq Tc \leq -40 \times Ti + 1700 \quad (1)$$

(b) Suitable Range of Thickness (Tc) of Top Conductor

In the above (a), it has been confirmed that, in order to obtain a good result in an electric insulation and an occurrence of a crack accompanying a heat cycle test, the thickness (Ti) of an insulation layer and the thickness (Tc) of a top conductor need to meet the relation expressed by the above-mentioned formula (1). Next, in this working example, the influence of the thickness (Tc) of a top conductor on the total thermal resistance of the whole substrate was investigated. The combinations of the thickness (Tc) of a top conductor and the thickness (Ti) of an insulation layer in the various samples for a valuation and the evaluation results about the total thermal resistance of the whole substrate are enumerated in the following Table 2.

In addition, since the absolute value of a total thermal resistance of a whole substrate is greatly influenced with the thickness (Ti) of an insulation layer which the substrate comprises, in this working example, the thermal resistances in various thicknesses (Tc) of top conductors were investigated for each of a group with the thickness (Ti) of the insulation layer constant at 6 micrometers (hereinafter, will be referred to as "1Q group") and a group with the thickness (Ti) of the insulation layer constant at 38 micrometers (hereinafter, will be referred to as "1R group"). In addition, in both groups, from the viewpoints of a soldering property with an LED and a bond strength with a substrate, etc., for example, the lower limit of the thickness (Tc) of a top conductor was set to 5 micrometers, and relative values (percentages) of the thermal resistances on the basis of the sample with the thickness (Tc) of the top conductor constant at 5 micrometers in each group (CE 1Q-1 and CE 1R-1) were compared.

TABLE 2

| | Tc [μm] | Ti [μm] | Thermal Resistance (TR) [° C./W] | Relative Value of TR [%] | Comment |
|---|---|---|---|---|---|
| CE 1Q-1 | 5 | 6 | 3 | 100 | Reference |
| CE 1Q-2 | 10 | 6 | 2.8 | 93 | |
| CE 1Q-3 | 15 | 6 | 2.7 | 90 | |
| WE 1Q-1 | 20 | 6 | 2.1 | 70 | Greatly Reduced Thermal Resistance |
| WE 1Q-2 | 30 | 6 | 1.7 | 57 | |
| WE 1Q-3 | 50 | 6 | 1.5 | 50 | |
| WE 1Q-4 | 75 | 6 | 1.4 | 47 | |
| WE 1Q-5 | 100 | 6 | 1.3 | 43 | |
| CE 1Q-4 | 110 | 6 | — | — | Crack after H/C |
| CE 1R-1 | 5 | 40 | 10.0 | 100 | Reference |
| CE 1R-2 | 10 | 40 | 9.8 | 98 | |
| CE 1R-3 | 15 | 40 | 9.6 | 93 | |
| WE 1R-1 | 20 | 40 | 7.0 | 70 | Greatly Reduced Thermal Resistance |
| WE 1R-2 | 30 | 40 | 6.8 | 68 | |
| WE 1R-3 | 50 | 40 | 6.4 | 64 | |
| WE 1R-4 | 75 | 40 | 6.3 | 63 | |
| WE 1R-5 | 100 | 40 | 6.2 | 62 | |
| CE 1R-4 | 110 | 40 | — | — | Crack after H/C |

As apparent from the results in Table 2, it was observed that the total thermal resistance of the whole substrate has a tendency to fall in association with an increase of the thickness (Tc) of a top conductor in both cases where the thickness (Ti) of an insulation layer is 6 micrometers and 40 micrometers (namely, in any of 1Q group and 1R group). It is thought that this is because, the larger the thickness (Tc) of a top conductor is, the more likely the heat conducted into the inside of a top conductor through an electric connection section with an LED (namely, an external surface of the top conductor) conducts deeply in the thickness direction of a substrate when the heat passes through the inside of the top conductor to be conducted to an insulation layer which intervenes between a metal base and the top conductor.

Furthermore, as apparent from the results in Table 2, the tendency of the total thermal resistance of the whole substrate to fall in association with an increase of the thickness (Tc) of a top conductor was more noticeable in the samples with the thickness (Tc) of the top conductor of not less than 20 micrometers (WE 1Q-1 to 1Q-5, and WE 1R-1 and 1R-5). On the other hand, in the samples with thickness (Tc) of a top conductor of more than 110 micrometers (CE 1Q-4 and CE 1R-4), an occurrence of a crack accompanying a heat cycle test (H/C) was observed. Namely, it was confirmed that it is desirable that the thickness (Tc) of a top conductor is not less than 20 micrometers and 100 micrometers or less, in order to efficiently reduce the total thermal resistance of the whole substrate, without reducing reliability of a substrate, in a substrate for a light-emitting diode according to this working example.

3. Valuation of Various Sample Substrates (2)

Figure 4:
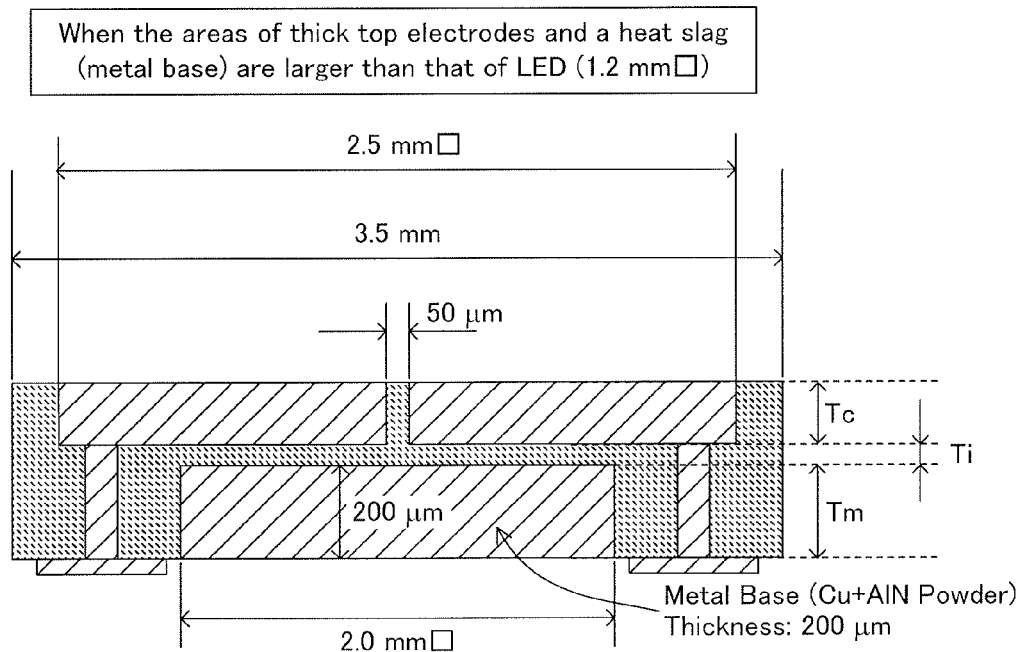
FIG. 4 is a schematic view showing an example of a configuration of a substrate for a light-emitting diode according to another embodiment of the present invention.

By the above-mentioned production method, various samples for a valuation of the substrate for a light-emitting diode which have various combinations of the thickness (Tc) of a top conductor and the thickness (Ti) of an insulation layer were manufactured. Here, the various samples for a valuation of the substrate for a light-emitting diode according to this working example will be explained, referring to an accompanying drawing. FIG. 4 is a schematic view showing another example of a configuration of a substrate for a light-emitting diode according to one embodiment of the present invention, as mentioned above. The configuration of the substrate for a light-emitting diode according the embodiment shown in FIG. 4 is the same as that of the substrate for a light-emitting diode according to the embodiment shown in FIG. 3, except that the material of a metal base is a mixture of copper (Cu) powder and aluminum-nitride (AlN) powder, the dimension of the metal base is 2.0 mm square which is considerably larger than the dimension of an LED (1.2 mm square), the dimension of the top conductor which has the thickness meeting the requirements for the present invention is also 2.5 mm square considerably larger than the dimension of an LED (1.2 mm square), a via conductor in the location where a metal base does not exist (in a projection to a plane parallel to the principal plane of the substrate), and the via conductor is electrically connected with the top conductor and the bottom conductor directly.

Under the conditions as mentioned above, various samples for a valuation of the substrate for a light-emitting diode with the thickness (Tc) of a top conductor and the thickness (Ti) of an insulation layer variously changed as shown in the following Table 3 and Table 4 were manufactured, and the influences of the thickness (Tc) of the top conductor and the thickness (Ti) of the insulation layer on the electric insulation (existence or non-existence of an electrical short) of the whole substrate, the occurrence of a crack in the insulation layer after a heat cycle test, and the thermal resistance were investigated. The results of such valuations will be explained in detail below. However, the measurement methods and valuation standards of various evaluation items and the conditions of a heat cycle test are the same as those of the above-mentioned "2. Valuation of various sample substrates (1)."

(a) Relation Between Thickness (Tc) of Top Conductor and Thickness (Ti) of Insulation Layer In this working example, first, the influences of the combination of the thickness (Tc) of a top conductor and the thickness (Ti) of an insulation layer on an electric insulation and an occurrence of a crack accompanying a heat cycle test were investigated. The combinations of the thickness (Tc) of a top conductor and the thickness (Ti) of an insulation layer in the various samples for a valuation, and the evaluation results about the electric insulation and the occurrence of a crack accompanying a heat cycle test are enumerated in the following Table 3.

TABLE 3

| | Tc [μm] | Ti [μm] | Electric Insulation | Crack after H/C | Overall Valuation |
|---|---|---|---|---|---|
| WE 2P-1 | 20 | 6 | Good | None | Good |
| WE 2P-2 | 60 | 5 | Good | None | Good |
| WE 2P-3 | 80 | 4.5 | Good | None | Good |
| WE 2P-4 | 100 | 4 | Good | None | Good |
| WE 2P-5 | 20 | 42 | Good | None | Good |
| WE 2P-6 | 60 | 41 | Good | None | Good |
| WE 2P-7 | 80 | 40.5 | Good | None | Good |
| WE 2P-8 | 100 | 40 | Good | None | Good |
| CE 2P-1 | 20 | 5 | Poor | None | Poor |
| CE 2P-2 | 60 | 4 | Poor | None | Poor |
| CE 2P-3 | 80 | 4 | Poor | None | Poor |
| CE 2P-4 | 100 | 3 | Poor | None | Poor |
| CE 2P-5 | 20 | 44 | Good | Exist | Poor |
| CE 2P-6 | 60 | 43 | Good | Exist | Poor |
| CE 2P-7 | 80 | 43 | Good | Exist | Poor |
| CE 2P-8 | 100 | 42 | Good | Exist | Poor |

As apparent from the results in Table 3, it turns out that the thickness (Ti) of an insulation layer needs to fall within a specific range in order to attain a good electric insulation and suppress the occurrence of a crack accompanying a heat cycle test, even if the thickness (Tc) of the top conductor falls within a suitable range in the present invention (not less than 20 micrometers, 100 micrometers or less). However, a good evaluation result was not obtained only by the thickness (Ti) of the insulation layer falling within a specific range, but it was observed that the upper limit and lower limit of the suitable range of the thickness (Ti) of an insulation layer change corresponding to the thickness (Tc) of a top conductor.

Specifically, even if the thickness (Ti) of an insulation layer is constant at 5 micrometers, while there is a problem in neither electric insulation nor occurrence of a crack and therefore it is judged as "good" when the thickness (Tc) of a top conductor is 60 micrometers (WE 2P-2), an electric insulation is judged as "poor" when the thickness (Tc) of a top conductor is 20 micrometers (CE 2P-1). Moreover, even if the thickness (Ti) of an insulation layer is constant at 42 micrometers, while it is judged as "good" when the thickness (Tc) of a top conductor is 20 micrometers (WE 2P-5), an occurrence of a crack accompanying a heat cycle test was observed when the thickness (Tc) of a top conductor was 100 micrometers (CE 2P-8).

Then, from a relation between various combinations of the thickness (Tc) of a top conductor and the thickness (Ti) of an insulation layer and the evaluation results about the corresponding samples for a valuation, it was found out that, in the substrate in which the thickness (Tm) of a metal base is not less than 100 micrometers, a good result in both of an electric insulation and occurrence of a crack accompanying a heat cycle test can be obtained when the thickness (Ti) of an insulation layer and the thickness (Tc) of a top conductor meet the relation expressed by the above-mentioned formula (1).

(b) Suitable Range of Thickness (Tc) of Top Conductor

In the above (a), it has been again confirmed that, in order to obtain a good result in an electric insulation and an occurrence of a crack accompanying a heat cycle test, the thickness (Ti) of an insulation layer and the thickness (Tc) of a top conductor need to meet the relation expressed by the above-mentioned formula (1). Next, in this working example, the influence of the thickness (Tc) of a top conductor on the total thermal resistance of the whole substrate was investigated. The combinations of the thickness (Tc) of a top conductor and the thickness (Ti) of an insulation layer in the various samples for a valuation and the evaluation results about the total thermal resistance of the whole substrate are enumerated in the following Table 4. In addition, the setting method of a reference for a valuation of the relative value (percentage) of a thermal resistance is the same as that of the above-mentioned "2. Valuation of various sample substrates (1)."

In addition, since the absolute value of a total thermal resistance of a whole substrate is greatly influenced with the thickness (Ti) of an insulation layer which the substrate comprises, also in this working example, the thermal resistances in various thicknesses (Tc) of top conductors were investigated for each of a group with the thickness (Ti) of the insulation layer constant at 6 micrometers (hereinafter, will be referred to as "2Q group") and a group with the thickness (Ti) of the insulation layer constant at 38 micrometers (hereinafter, will be referred to as "2R group"), similarly to the above-mentioned "2. Valuation of various sample substrates (1)."

TABLE 4

| | Tc [μm] | Ti [μm] | Thermal Resistance (TR) [° C./W] | Relative Value of TR [%] | Comment |
|---|---|---|---|---|---|
| CE 2Q-1 | 5 | 6 | 2.4 | 100 | Reference |
| CE 2Q-2 | 10 | 6 | 2.3 | 96 | |
| CE 2Q-3 | 15 | 6 | 2.2 | 92 | |
| WE 2Q-1 | 20 | 6 | 1.6 | 67 | Greatly Reduced Thermal Resistance |
| WE 2Q-2 | 30 | 6 | 1.5 | 63 | |
| WE 2Q-3 | 50 | 6 | 1.4 | 58 | |
| WE 2Q-4 | 75 | 6 | 1.3 | 54 | |
| WE 2Q-5 | 100 | 6 | 1.2 | 50 | |
| CE 2Q-4 | 110 | 6 | — | — | Crack after H/C |
| CE 2R-1 | 5 | 40 | 8.4 | 100 | Reference |
| CE 2R-2 | 10 | 40 | 8.2 | 98 | |
| CE 2R-3 | 15 | 40 | 8.0 | 95 | |
| WE 2R-1 | 20 | 40 | 5.8 | 69 | Greatly Reduced Thermal Resistance |
| WE 2R-2 | 30 | 40 | 5.6 | 67 | |
| WE 2R-3 | 50 | 40 | 5.3 | 63 | |
| WE 2R-4 | 75 | 40 | 5.2 | 62 | |
| WE 2R-5 | 100 | 40 | 5.1 | 61 | |
| CE 2R-4 | 110 | 40 | — | — | Crack after H/C |

As apparent from the results in Table 4, it was observed that the total thermal resistance of the whole substrate has a tendency to fall in association with an increase of the thickness (Tc) of a top conductor in both cases where the thickness (Ti) of an insulation layer is 6 micrometers and 40 micrometers (namely, in any of 2Q group and 2R group). It is thought that this is because, the larger the thickness (Tc) of a top conductor is, the more likely the heat conducted into the inside of a top conductor through an electric connection section with an LED (namely, an external surface of the top conductor) conducts deeply in the thickness direction of a substrate when the heat passes through the inside of the top conductor to be conducted to an insulation layer which intervenes between a metal base and the top conductor, as well as, the heat conducted into the inside of a top conductor through an electric connection section with an LED (namely, an external surface of the top conductor) spreads to a large area in a plane parallel to the principal plane of the substrate due to the large area of the top conductor and therefore the influence of a relatively high thermal resistance of the insulation layer on the total thermal resistance of the whole substrate when conducting the heat to the metal base through the insulation layer is reduced.

Furthermore, as apparent from the results in Table 4, the tendency of the total thermal resistance of the whole substrate to fall in association with an increase of the thickness (Tc) of a top conductor was more noticeable in the samples with the thickness (Tc) of the top conductor of not less than 20 micrometers (WE 2Q-1 to 2Q-5, and WE 2R-1 and 2R-5). On the other hand, in the samples with thickness (Tc) of a top conductor of more than 110 micrometers (CE 2Q-4 and CE 2R-4), an occurrence of a crack accompanying a heat cycle test (H/C) was observed. Namely, it was again confirmed that it is desirable that the thickness (Tc) of a top conductor is not less than 20 micrometers and 100 micrometers or less, in order to efficiently reduce the total thermal resistance of the whole substrate, without reducing reliability of a substrate, in a substrate for a light-emitting diode according to this working example.

4. Conclusion

As mentioned above, it has been confirmed that a high heat dissipation capacity can be shown without reducing insulation reliability and high-humidity reliability of a substrate by achieving a low thermal resistance as the total thermal resistance of the whole substrate, in accordance with a substrate for a light-emitting diode according to the present invention, which is constituted so that the thickness of a top conductor for an electrical connection with a light-emitting diode (LED) falls within a predetermined range (specifically, not less than 20 micrometers and 100 micrometers or less) and the thickness of the insulation layer which electrically insulates a metal base and a top conductor and the thickness of a top conductor meet a predetermined relation (specifically, the relation expressed by formula (1)), even in a case where the substrate comprises a metal base which has a thickness of a predetermined value (specifically, 100 micrometers) or more.

Figure 6:
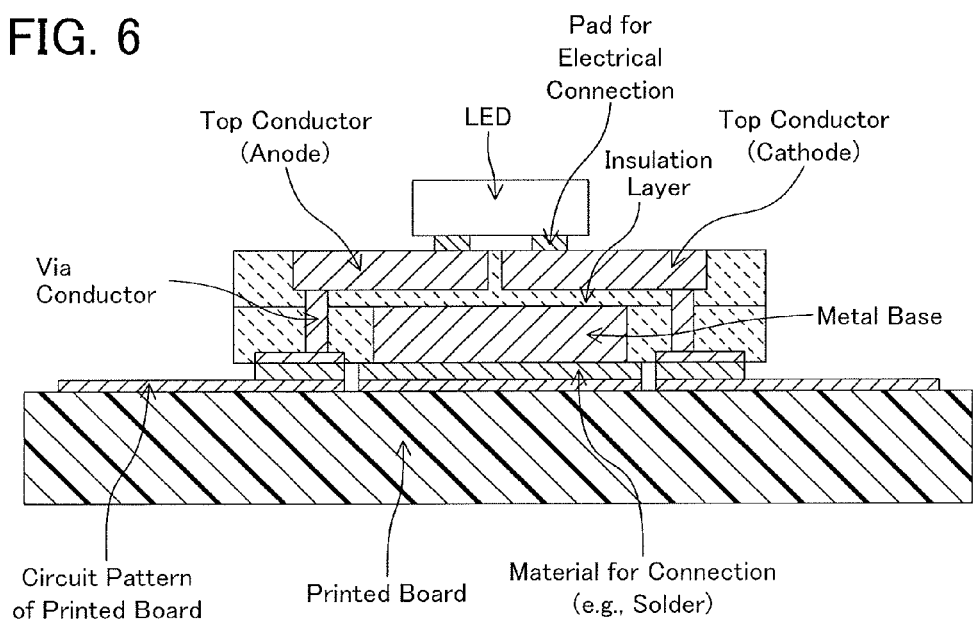
FIG. 6 is a schematic view showing an example of a configuration of an LED package containing a substrate for a light-emitting diode according to one embodiment of the present invention.

In addition, an example of application of the substrate for a light-emitting diode according to the present invention will be explained here, referring to an accompanying drawing. FIG. 6 is a schematic view showing an example of a configuration of an LED package containing a substrate for a light-emitting diode according to one embodiment of the present invention, as mentioned above. As shown in FIG. 6, in the LED package comprising the substrate for a light-emitting diode according to the present embodiment, heat which is generated in association with light emission of LED conducts to a printed board through the substrate for a light-emitting diode. At this time, since the substrate for a light-emitting diode according to the present embodiment has a configuration which meets the requirements for the present invention, a lower thermal resistance and higher reliability (reduction of crack occurrence accompanying exposure to a repetition of temperature change) can be presented, as compared with the prior art. As a result, the LED package shown in FIG. 6 can show outstanding energy efficiency and reliability.

Although some embodiment and corresponding working examples which have a specific configuration have been explained, sometimes referring to accompanying drawings, as mentioned above, for the purpose of explaining the present invention, the scope of the present invention should not be interpreted to be limited to these exemplary embodiments and working examples, and it is needless to say that modifications can be suitably added within the range of the matters described in the claims and the specification.

The invention claimed is:

1. A substrate for a light-emitting diode, comprising:
   a metal base,
   an insulation layer which comprises a dielectric material that mainly contains a ceramic and which has a portion placed on a first top surface of said metal base, and
   a top conductor which is at least partially embedded within said insulation layer and at least partially exposed out of a top surface of said insulation layer on the side opposite to said first top surface,
   wherein:
   said insulation layer also covers side surfaces of said metal base,
   a thickness (Tm) of said metal base in a thickness direction, which is defined as a direction intersecting perpendicularly with said first top surface of said metal base, is at least 100 micrometers,
   a thickness (Tc) of said top conductor in said thickness direction is 20 micrometers to 100 micrometers, and
   a thickness (Ti) of a portion between said first top and said top conductor in said insulation layer in said thickness direction and said thickness (Tc) of said top conductor in said thickness direction meet the relation expressed by:

$$-40 \times Ti + 260 \leq Tc \leq -40 \times Ti + 1700.$$

2. The substrate for a light-emitting diode according to claim 1, wherein:
   the maximum value (Tbmax) of the thickness (Tb) of the portion of said top conductor embedded within said insulation layer in said thickness direction is not less than 10 micrometers.

3. The substrate for a light-emitting diode according to claim 2, wherein:
   the maximum value (Tbmax) of the thickness (Tb) of the portion of said top conductor embedded within said insulation layer in said thickness direction is ½ (one half) or more of the thickness (Tc) of said top conductor in said thickness direction.

4. The substrate for a light-emitting diode according to claim 1, wherein:
   said top conductor is divided into at least two or more regions.

5. The substrate for a light-emitting diode according to claim 4, wherein:
   a dielectric material fills a gap between said at least two or more regions of said top conductor.

6. The substrate for a light-emitting diode according to claim 2, wherein:
   said top conductor is divided into at least two or more regions.

7. The substrate for a light-emitting diode according to claim 3, wherein:
   said top conductor is divided into at least two or more regions.

* * * * *